(12) United States Patent
Hashim et al.

(10) Patent No.: US 9,001,554 B2
(45) Date of Patent: Apr. 7, 2015

(54) RESISTIVE RANDOM ACCESS MEMORY CELL HAVING THREE OR MORE RESISTIVE STATES

(71) Applicants: Intermolecular Inc., San Jose, CA (US); Kabushiki Kaisha Toshiba, Tokyo (JP); SanDisk 3D LLC, Milpitas, CA (US)

(72) Inventors: Imran Hashim, Saratoga, CA (US); Ryan C. Clarke, San Jose, CA (US); Nan Lu, San Jose, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 198 days.

(21) Appl. No.: 13/738,061

(22) Filed: Jan. 10, 2013

(65) Prior Publication Data

US 2014/0192585 A1   Jul. 10, 2014

(51) Int. Cl.
 *H01L 45/00* (2006.01)
 *G11C 13/00* (2006.01)

(52) U.S. Cl.
 CPC ............ *G11C 13/0002* (2013.01); *H01L 45/08* (2013.01); *H01L 45/1233* (2013.01); *H01L 45/146* (2013.01)

(58) Field of Classification Search
 CPC ................ H01L 2924/00014; H01L 2924/00; H01L 45/146; G06F 12/0246
 See application file for complete search history.

(56) References Cited

U.S. PATENT DOCUMENTS

| | | | |
|---|---|---|---|
| 5,296,716 | A | 3/1994 | Ovshinsky et al. |
| 5,536,947 | A | 7/1996 | Klersy et al. |
| 6,906,939 | B2 | 6/2005 | Rinerson et al. |
| 6,965,137 | B2 | 11/2005 | Kinney et al. |
| 7,394,679 | B2 | 7/2008 | Rinerson et al. |
| 7,485,891 | B2 | 2/2009 | Hamann |

(Continued)

FOREIGN PATENT DOCUMENTS

WO    WO-2007-004843 A1    1/2007

OTHER PUBLICATIONS

Baek, I.G., et al.; MultiLayer CrossPoint Binary Oxide Resistive Memory OxRRAM for PoastNAND Storage Application; Jan. 1, 2005; Samsung Electronics Co., Ltd.

(Continued)

*Primary Examiner* — Hoai V Ho
*Assistant Examiner* — Roberto Mancera (57) ABSTRACT

Provided are resistive random access memory (ReRAM) cells, each having three or more resistive states and being capable of storing multiple bits of data, as well as methods of fabricating and operating such ReRAM cells. Such ReRAM cells or, more specifically, their resistive switching layer have wide range of resistive states and are capable of being very conductive (e.g., about 1 kOhm) in one state and very resistive (e.g., about 1 MOhm) in another state. In some embodiments, a resistance ratio between resistive states may be between 10 and 1,000 even up to 10,000. The resistive switching layers also allow establishing stable and distinct intermediate resistive states that may be assigned different data values. These layers may be configured to switching between their resistive states using fewer programming pulses than conventional systems by using specific materials, switching pluses, and resistive state threshold.

19 Claims, 7 Drawing Sheets

(56) References Cited

U.S. PATENT DOCUMENTS

| | | | |
|---|---|---|---|
| 7,488,968 B2 | 2/2009 | Lee | |
| 7,692,949 B2 | 4/2010 | Nirschl | |
| 7,718,988 B2 | 5/2010 | Lee | |
| 7,719,886 B2 | 5/2010 | Philipp et al. | |
| 7,791,923 B2 * | 9/2010 | Baek et al. | 365/148 |
| 7,808,810 B2 | 10/2010 | Herner | |
| 7,960,224 B2 * | 6/2011 | Chien et al. | 438/199 |
| 8,000,127 B2 * | 8/2011 | Hamilton et al. | 365/148 |
| 8,045,364 B2 * | 10/2011 | Schloss et al. | 365/148 |
| 8,062,918 B2 * | 11/2011 | Miller et al. | 438/45 |
| 8,101,937 B2 | 1/2012 | Chiang | |
| 8,264,866 B2 * | 9/2012 | Fukumizu et al. | 365/148 |
| 8,274,066 B2 * | 9/2012 | Miller et al. | 257/4 |
| 8,465,996 B2 * | 6/2013 | Miller et al. | 438/45 |
| 8,520,425 B2 * | 8/2013 | Xiao et al. | 365/148 |
| 8,551,809 B2 * | 10/2013 | Kumar et al. | 438/104 |
| 8,581,224 B2 * | 11/2013 | Sandhu et al. | 257/4 |
| 8,686,389 B1 * | 4/2014 | Wang et al. | 257/2 |
| 8,766,233 B2 * | 7/2014 | Sakotsubo et al. | 257/4 |
| 8,787,066 B2 * | 7/2014 | Wang et al. | 365/148 |
| 8,817,524 B2 * | 8/2014 | Wang et al. | 365/148 |
| 2004/0160820 A1 | 8/2004 | Rinerson | |
| 2006/0109704 A1 | 5/2006 | Seo et al. | |
| 2006/0245243 A1 | 11/2006 | Rinerson | |
| 2007/0159869 A1 * | 7/2007 | Baek et al. | 365/148 |
| 2007/0236981 A1 | 10/2007 | Herner | |
| 2008/0011996 A1 | 1/2008 | Bednorz et al. | |
| 2008/0200003 A1 | 8/2008 | Hong | |
| 2009/0026433 A1 | 1/2009 | Chiang | |
| 2009/0180314 A1 | 7/2009 | Liu | |
| 2009/0272962 A1 * | 11/2009 | Kumar et al. | 257/4 |
| 2011/0038195 A1 * | 2/2011 | Hamilton et al. | 365/148 |
| 2011/0149634 A1 * | 6/2011 | Schloss et al. | 365/148 |
| 2012/0091417 A1 | 4/2012 | Chiang | |
| 2012/0188813 A1 * | 7/2012 | Chien et al. | 365/148 |
| 2013/0221315 A1 * | 8/2013 | Wang et al. | 257/4 |
| 2013/0270508 A1 * | 10/2013 | Li et al. | 257/4 |
| 2014/0001430 A1 * | 1/2014 | Miller et al. | 257/2 |
| 2014/0001431 A1 * | 1/2014 | Kumar et al. | 257/4 |
| 2014/0103284 A1 * | 4/2014 | Hsueh et al. | 257/4 |
| 2014/0124725 A1 * | 5/2014 | Chi et al. | 257/4 |
| 2014/0151626 A1 * | 6/2014 | Phatak | 257/4 |
| 2014/0175359 A1 * | 6/2014 | Wang et al. | 257/2 |
| 2014/0175360 A1 * | 6/2014 | Tendulkar et al. | 257/4 |
| 2014/0175363 A1 * | 6/2014 | Tendulkar et al. | 257/4 |

OTHER PUBLICATIONS

Lee et al.; MultiLevel Switching of TripleLayered TaOx RRAM with Excellent Reliability for Storage Class Memory; Jan. 1, 2012; 2012 Symposium on VLSI Technology Digest of Technical Papers.

* cited by examiner

RESISTIVE RANDOM ACCESS MEMORY CELL HAVING THREE OR MORE RESISTIVE STATES

TECHNICAL FIELD

The present invention relates generally to semiconductor devices and processes and, more specifically, to resistive random access memory (ReRAM) cells having three or more resistive states as well as methods of fabricating and operating such cells.

BACKGROUND

Nonvolatile memory is computer memory capable of retaining the stored information even when unpowered. Nonvolatile memory may be used for secondary storage or long-term persistent storage, for example, in addition to volatile memory. Nonvolatile memory can be permanently integrated into computer systems (e.g., solid state hard drives) or it can take the form of removable and easily transportable memory cards (e.g., USB flash drives). Nonvolatile memory is becoming more popular because of its small size and high density, low power consumption, fast read and write rates, data retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory (ReRAM), are being developed to meet these demands and requirements.

SUMMARY

Provided are resistive random access memory (ReRAM) cells, each having three or more resistive states and being capable of storing multiple bits of data, as well as methods of fabricating and operating such ReRAM cells. Such ReRAM cells or, more specifically, their resistive switching layer have wide range of resistive states and are capable of being very conductive (e.g., about 1 kOhm) in one state and very resistive (e.g., about 1 MOhm) in another state. In some embodiments, a resistance ratio between resistive states may be between 10 and 1,000 even up to 10,000. For example, the resistance ratio between resistive states may be at least about 100 and less than 10,000. The resistive switching layers also allow establishing stable and distinct intermediate resistive states that may be assigned different data values. These layers may be configured to switch between their resistive states using fewer programming pulses than conventional systems by using specific materials, switching pluses, and resistive state threshold. Some examples of suitable materials may include hafnium oxide, zirconium oxide, silicon oxide, and combinations of titanium oxide and aluminum oxide. The resistive switching layer may also include a dopant, such as titanium, hafnium, and aluminum.

In some embodiments, a method of switching a ReRAM cell among three or more resistive states involves providing the ReRAM cell having a resistive switching layer, which is formed from one of hafnium oxide, zirconium oxide, silicon oxide, or a combination of titanium oxide and aluminum oxide. The resistive switching layer has a first resistance when the ReRAM cell is provided. The method then proceeds with applying a first set of programming pulses to the ReRAM cell. After applying the first set of programming pulses, the resistive switching layer has a second resistance, which is less than the first resistance. The method then proceeds with applying a second set of programming pulses to the ReRAM cell. After applying the second set of programming pulses, the resistive switching layer has a third resistance less than the second resistance. The ratio of the first resistance to the third resistance is between 10 and 1000 or, more specifically, at least 100. The ratio of the first resistance to the second resistance is at least 5. The second resistance is greater than the third resistance. In some embodiments, the first set has less than three programming pulses. The voltage of each programming pulse in the first set of programing pulses may be increased by a predetermined value.

In some embodiments, applying the first set of programming pulses further comprises applying a read pulse after each programming pulse. The read pulse is used to determine a current resistive state of the ReRAM cell and determine whether an additional programming pulse is needed. In some embodiments, the ratio of the second resistance to the third resistance is at least 5. The second set may have less than three programming pulses.

In some embodiments, the method also involves applying a third set of programming pulses to the ReRAM cell. After applying the third set of programming pulses, the resistive switching layer has a fourth resistance less than the third resistance. The ratio of the third resistance to the fourth resistance is at least 5.

In some embodiments, the method also involves applying a set of erase pulses to the ReRAM cell. After applying the set of erase pulses, the resistive switching layer has the first resistance. The set of erase pulses may include less than four pulses. In some embodiments, applying the first set of erase pulses also involves applying a read pulse after each programming pulse. The read pulse is used to determine a current resistive state of the ReRAM cell and determine whether an additional erase pulse is needed.

In some embodiments, applying the first set of programming pulses to the ReRAM cell involves (a) applying a programming pulse, (b) determining a present resistance of the resistive switching layer, and (c) comparing the present resistance to a threshold resistance. Furthermore, operations (a)-(c) may be repeated, if the present resistance is higher than the threshold resistance. In some embodiments, two sequential pulses in the first set of programming pulses have a voltage difference of between 0.1V and 0.3V. The method may also involve applying a set of forming pulses before applying the first set of programming pulses. The resistive switching layer may include a dopant such as titanium, hafnium, or aluminum. For example, the resistive switching layer may include hafnium oxide doped with titanium. Alternatively, the resistive switching layer may include silicon oxide doped with hafnium. The resistive switching layer may be connected in series with a transistor.

In some embodiments, the resistive switching layer includes a first sub-layer, a second sib-layer, and a third sub-layer. The first sub-layer may include titanium oxide, the second sub-layer may include hafnium oxide, while the third sub-layer may include silicon oxide. In some embodiments, the first sub-layer directly interfaces a first electrode, the third sub-layer directly interfaces a second electrode, while the second sub-layer is disposed between the first sub-layer and the third sub-layer. The second sub-layer may directly interface the first sub-layer and the third sub-layer. The first electrode may include titanium nitride, while the second electrode may include n-doped polysilicon.

In some embodiments, the resistive random access memory cell includes a first electrode layer having an oxygen reactive material, a second electrode layer having an oxygen inert material, and a resistive switching layer having one of hafnium oxide, zirconium oxide, silicon oxide, or a combination of titanium oxide and aluminum oxide. The resistive switching layer is capable of being switched among four or more different resistive states such that a ratio of resistances in at least two of the four or more different resistive states is between 10 and 1000.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack. The structure of this stack is sometimes described as a Metal-Insulator-Metal (MIM). Specifically, the stack includes two conductive layers operating as electrodes. These layers are identified as "M" and may include metals and/or other conductive materials. The stack also includes an insulator layer disposed in between the electrodes. This layer is identified as "I" in the above naming convention. The insulator layer exhibits resistive switching properties by being able to change its resistive states and remain in these states until switch into new states. As such, this insulator layer is often referred to as a resistive switching layer. These resistive states may be used to represent one or more bits of information. For example, two resistive states may correspond to one bit, while four resistive states may correspond to two bits, and so on. In some embodiments, a single ReRAM cell may store two, three, four, five, and even more bits of information.

The resistive switching layer changes its resistive state when a certain switching voltage (e.g., a programming voltage or a erase voltage) is applied to this layer as further described below. The switching voltage causes localized heating within the layer and/or at one of both of its interfaces with other components. Without being restricted to any particular theory, it is believed that a combination of this localized heating as well as an electrical field (both created by the switching voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers. For purposes of this disclosure, an operating of applying a switching voltage is referred to as a switching pulse. The switching pulse has certain duration. In other words, the switching pulse is applied for a predetermined period of time, for example, between 10 nanoseconds and 100 nanoseconds, such as about 50 nanoseconds. Switching pulses may be distinguished into setting pulses, during which the resistance of the switching layers is increased, and resetting pulses, during which the resistance of the switching layers is decreased. The setting pulses may be also referred to as programming pulses, while resetting pulses may be referred to as erase pulses. In some embodiments, multiple switching pulses are needed to change the resistance of the resistive switching layer, i.e., to switch the resistive switching layer between its two or more different resistive states.

A read pulse may be used to determine the current resistive state of the switching layer. The read pulse does not switch the resistive state. As such, the read pulse may have a lower voltage and/or duration. In some embodiments, the read pulse may be between about 0.2V and 0.8V, such as about 0.5V, and the pulse duration may be between about 20 nanoseconds and 80 nanoseconds, such as about 50 nanoseconds. The polarity of the read pulse may be the same as the polarity of the set pulse. The read pulse may be used during data retrieval and during switching, e.g., to determine whether the switching to the desired resistive state has actually occurred. For example, a set of switching pulses, which may include one or more switching pulses, may be followed by a read pulse. For comparison, the set and reset pulses may be ramped up above 2V and even 3V. If the read pulse indicates that the ReRAM has not reached it desired resistive state, the process of applying the set of switching pulses and the read pulse is repeated as further described below with reference to FIG. 7.

In described ReRAM cells, a resistive switching layer may be present in three or more different resistive states, i.e., the two end states and one or more intermediate states. Each resistive state needs to be substantially distinct from all other remaining states such that each state can be distinguished during the read operation. As such, the overall resistive range defined by the two end states, i.e., highest resistive state and the lowest resistive state. The greater the difference, the more intermediate states may be established. In some embodiments, the resistance ratio of a ReRAM cells in its two end states is at least about 100 or at least about 1,000 and even at least about 10,000. In some embodiments, the upper limit for this ratio is less than 100,000. Furthermore, any defined intermediate states should be repeatable during operating lifetime of the memory cell.

As noted above, the resistive switching may be attributed to defect mobility within the resistive switching layer and through one or both interfaces of this layer with the electrodes. It may be desirable to move defects through only one interface of the resistive switching layer while keeping the other interface substantially inert. For purposes of this disclosure, the inert interface is defined as an interface that does not have any substantial defect transfer through this interface. While the defects may be present within one or both layers forming this interface (e.g., a resistive switching layer and an electrode), these defects are not exchanged through the interface when switching, read, or other types of voltages are applied to the ReRAM cell. The reactive interface is defined as an interface that experiences a substantial transfer of defects through the interface. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when, during programming or setting operations, a switching voltage is applied to the resistive switching layer in order to reduce its resistance, the reactive interface allows defects to flow into and out of the layer. The defects are typically driven by the electrical potential applied to the layer and form conductive paths through the layer. The direction of this defect flow may be determined by the polarity of the switching voltage and/or by the electrical charge of the defects (e.g., positive charged oxygen vacancies). At the same time, the second inert interface prevents defects from escaping the stack despite the driving potential.

The above scenario is applicable in a very similar manner to erase operations, which are sometimes referred to as re-programming or resetting operations. During the erase operation, the resistive switching layer is brought to its high resistive state. When a switching voltage is applied to the layer in order to increase its resistance of this layer, the reactive interface allows defects to flow out of the layer. The defects may also be driven by the electrical potential applied to the layer as described above. The loss of defects may bring the resistive switching layer to one of intermediate resistive states and eventually break conductive paths in the layer.

The ability of the resistive switching layer to switch between three or more resistive states may depend on properties of a material forming this layer. Some examples of such materials may include transition metal oxides, such as hafnium oxide ($HfO_x$), zirconium oxide ($ZrO_x$), silicon oxide ($SiO_x$), combinations of titanium oxide ($TiO_x$) and aluminum oxide ($AlO_x$), and so forth. The resistive switching layer may also include a dopant, such as titanium, hafnium, and aluminum. These materials allow forming different concentrations and distribution of defects corresponding to different resistive states. As noted above, the defects may be responsible for conductivity through the resistive switching layer. Furthermore, defects in the layers may be easily rearranged, added, and/or removed resulting in resistive switching.

Provided are ReRAM cells capable of switching among three or more resistive states. Switching among the resistive states may be performed by selectively applying switching voltages to the ReRAM cell. The resulting resistive state of the cell may be determined by applying a read pulse, e.g., by applying a lower read voltage and measuring a resulting current that corresponds to the respective resistive state. Performing a read pulse after each switching pulse or a set of switching pulses may be used to determine whether the ReRAM cell has changed its resistive state and whether the new resistive state falls within an identified and desired threshold.

In some embodiments, an appropriate voltage of a programming pulse may be based on the current resistive state and the direction of the desired switching. Thus, based on the current resistive state, a programming pulse with a specific voltage may be applied to achieve the specific resistive state.

Examples of Nonvolatile ReRAM Cells and their Switching Mechanisms

A brief description of ReRAM cells is provided for context and better understanding of various features associated with using multistate resistive switching layers in the ReRAM cells and their operation. As stated above, a ReRAM cell includes a dielectric material exhibiting multistate resistive switching characteristics. A dielectric, which is normally insulating, can be made to conduct through one or more conductive paths formed after application of a sufficiently high voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. The number, density, continuity, cross-section, and other like characteristics of the conductive paths determine different resistive states. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1A:
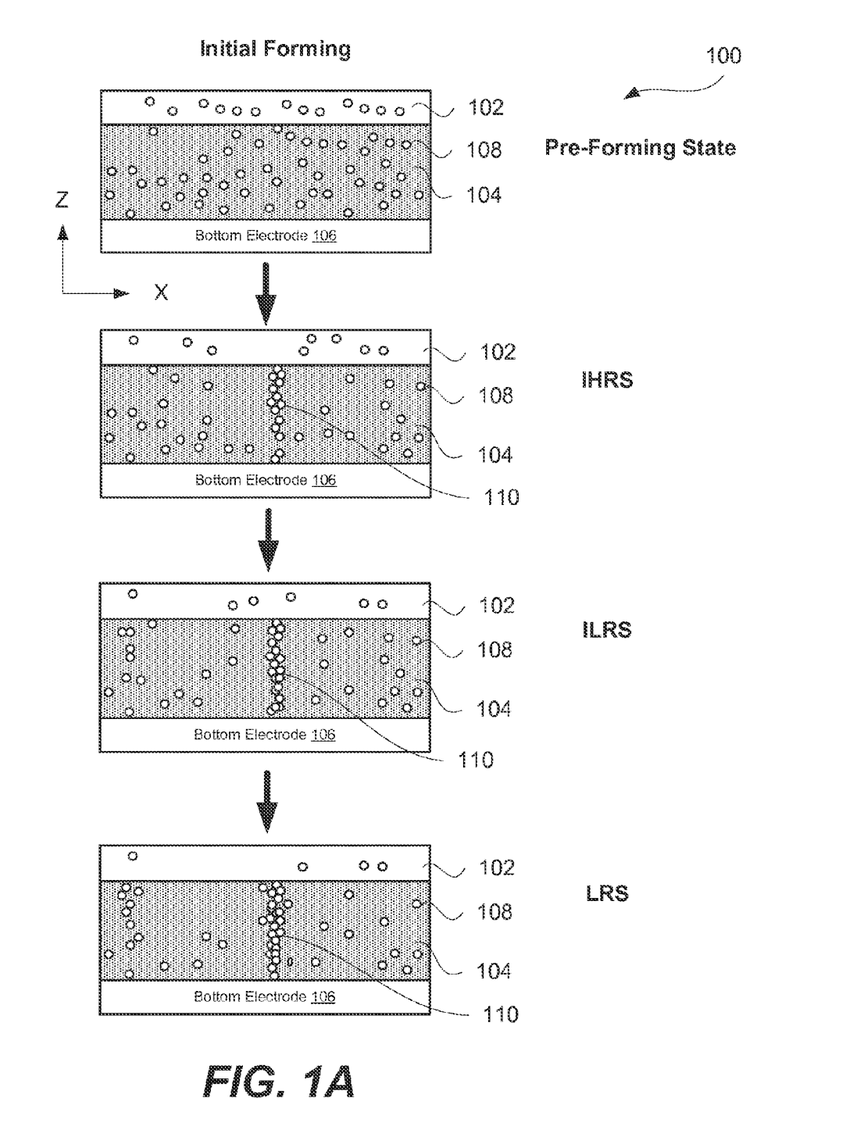
FIG. 1A illustrates a schematic representation of a ReRAM cell during an initial forming operation, in accordance with some embodiments.

FIG. 1A illustrates a schematic representation of ReRAM cell 100 during initial forming of a conductive path. While only one conductive path is shown in FIG. 1A, one having ordinary skills in the art would understand that ReRAM cell 100 may include any number of conductive paths. ReRAM cell 100 includes top electrode 102, bottom electrode 106, and resistive switching layer 104 disposed in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used to identify the two electrodes. ReRAM cell 100 may also include other components, such as a current steering element (e.g., a diode), diffusion barrier layer, and other components (not shown). ReRAM cell 100 is sometimes referred to as a single memory element or a memory unit.

Top electrode 102 and bottom electrode 106 may be used as conductive lines within a memory array or other types of devices that ReRAM cell is integrated into. As such, electrodes 102 and 106 are generally formed from conductive materials. As stated above, one of the electrodes may be a reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistive switching layer 104 may include a dielectric material. Dielectric material may be capable of resistive switching and exhibiting multistate resistive state as a data storage material layer. Examples of such material may include transition metal oxides, including hafnium oxide ($HfO_x$), zirconium oxide ($ZrO_x$), silicon oxide ($SiO_x$), combinations of titanium oxide ($TiO_x$) and aluminum oxide ($AlO_x$), and so forth. The resistive switching layer 104 may also include a dopant, such as titanium, hafnium, and aluminum.

Figure 1B:
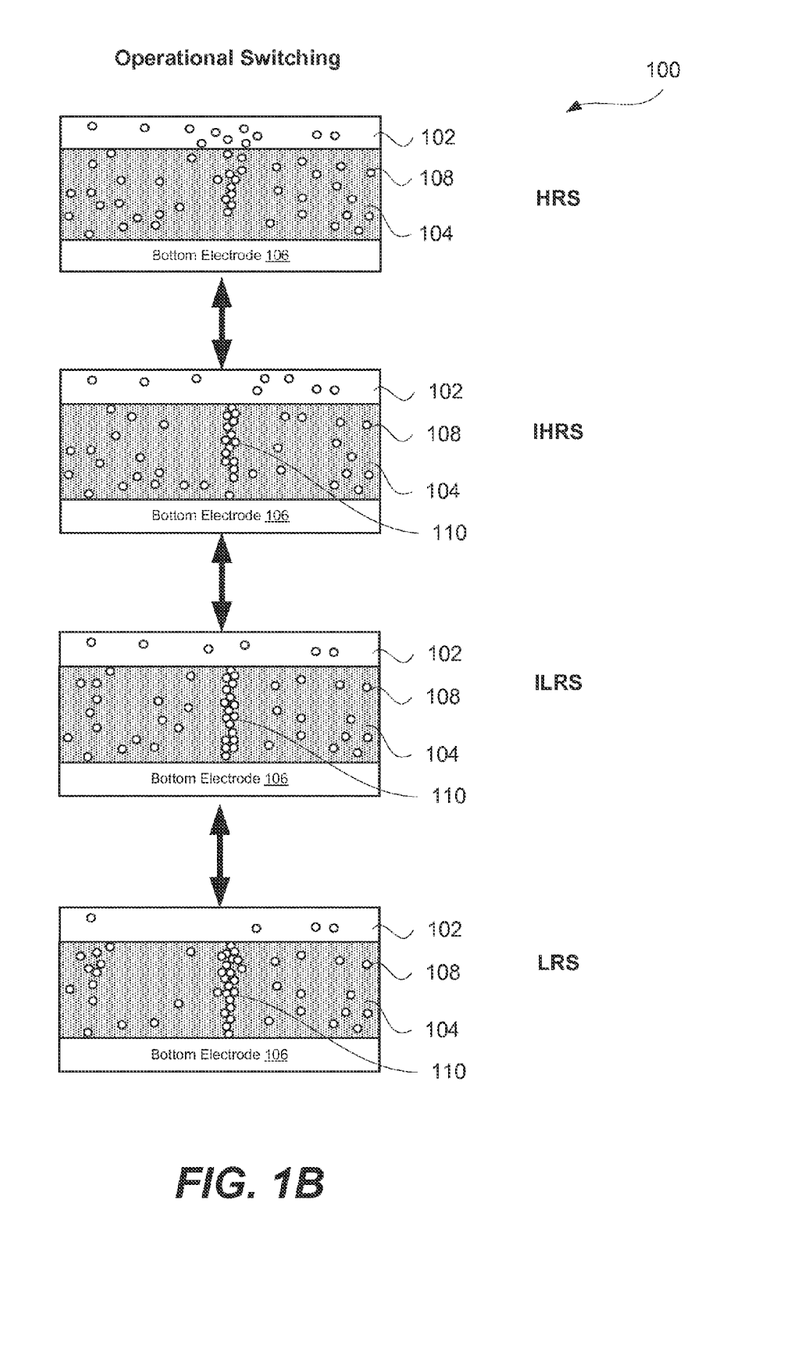
FIG. 1B illustrates a schematic representation of a ReRAM cell during operational switching between end and intermediate resistive states, in accordance with some embodiments.

Resistive switching layer 104 may be made to conduct through one or more conductive paths formed within the layer by applying first a set of forming voltages (as shown by FIG. 1A) and then a set of switching voltages (as shown by FIG. 1B) associated with different resistive states. The resistive states may have substantially distinct resistance levels to enable accurate detection of these resistive states.

Each resistive state may be associated with a certain bit pattern. For example, in a memory cell having four resistive states, the resistive states may be associated with the following bit patterns: state 1—00, state 2—01, state 3—10, state 4—11. Thus, the ReRAM cell having four resistive states may encode two bits of information, each bit having 1 (ON) and 0 (OFF) states. In comparison to a two state cell capable of storing only one bit of information, the data capacity of a multistate ReRAM is greater. For example, a decimal number 3 represented by a binary 10 can be encoded by just one cell with four resistive states (ILRS state representing bit pattern 10) instead of two cells, each having two resistive states.

To provide this resistive switching functionality, resistive switching layer 104 may include electrically active defects 108. In some embodiments, defects 108 are added to resistive switching layer 104 during its fabrication. Defects 108 may be also added and removed from resistive switching layer 104 during switching operations. In some embodiments, resistive switching layer 104 may be fabricated without any defects present and initial defects are added during formation of resistive switching layer 104.

Various types of defects may be used. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types, all charge carriers are referred to as defects 108.

In some embodiments, these defects may be utilized for ReRAM cells operating according to a valence change mechanism, which may occur in specific transition metal oxides. For example, defects include oxygen vacancies triggered by migration of oxygen anions. Migrations of oxygen anions may correspond to the motion of corresponding oxygen vacancies that are used to create and break conductive paths. A subsequent change of the stoichiometry in the transition metal oxides may lead to a redox reaction expressed by a valence change of the cation sublattice and a change in the electrical conductivity.

In some embodiments, different resistive states may correspond to different stages in formation of conductive paths. Thus, initial stages of formation of conductive paths may be associated with relatively higher resistive states, whereas completely formed conductive paths may provide for lower resistance of the resistive switching layer.

Additionally, in this example, the polarity of the pulse used to perform this change determines the direction of the change, i.e., reduction or oxidation. Other resistive switching mechanisms may include bipolar electrochemical metallization mechanisms and thermochemical mechanisms, which lead to a change of the stoichiometry due to a current-induced increase of the temperature. Some of these mechanisms will be further described below with reference to FIGS. 1A-1B. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 during initial formation of conductive paths, in accordance with some embodiments. Resistive switching layer 104 may include some defects 108. Additional defects 108 may be provided through the interface within top electrode 102. In some embodiments, the resistive switching layer 104 may have substantially no defects prior to the forming operation and all defects are provided from top electrode 102 during the forming. Bottom electrode 106 may or may not have any defects. It should be noted that regardless of presence or absence of defects in bottom electrode 106, substantially no defects are exchanged between bottom electrode 106 and resistive switching layer 104 during forming and/or switching operations.

During the forming operation, ReRAM cell 100 changes its structure by forming conductive pathways. ReRAM cell 100 may go from a pre-forming state to an intermediate high resistive state (IHRS). The IHRS may correspond to one of the states used during operation. This switch to the IHRS may involve formation of one or more conductive paths or filaments 110 within resistive switching layer 104. Filament 110 is formed by defects 108 being arranged into a continuous path within a dielectric. Without being restricted to any particular theory, it is believed that defects 108 can be reoriented within resistive switching layer 104 to form these conductive paths as, for example, schematically shown in the IHRS. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100.

Filament 110 that is formed when ReRAM cell is switching in the IHRS may be relatively thin and has relatively low conductivity in comparison to the later formed filaments. As such, the resistance of ReRAM cell 100 remains relatively high at this state. To further lower the resistance, ReRAM cell 100 may be subjected to additional forming pulses applied to electrodes 102 and 106. This pulse may cause additional defects 108 joining filament 110 or forming new filaments, thereby reducing the resistance through resistive switching layer 104. FIG. 1A illustrate an intermediate low resistive state (ILRS) and a low resistive state (LRS), which correspond to thicker filaments 110. In some embodiments, the forming operation does not include any intermediate steps and ReRAM cell 100 is brought into the LRS directly without going through any intermediate steps or at least not detecting any intermediate steps.

In general, the forming operation may be considered to be a part of the fabrication of ReRAM cell 100, while subsequent resistive switching may be considered to be a part of operation of ReRAM cell 100. After forming is completed, filament 110 may be partially broken thus destroying the conductivity path. Defects forming filament 110 may not completely disperse and stay in a proximity to each other making it easier to reform a conductivity path. Such state may be referred to as a high resistive state (HRS).

Resistive switching involves breaking and reforming conductive paths through resistive switching layer 104, i.e., switching between different resistive states as schematically illustrated in FIG. 1B. For example, two end states (i.e., HRS and LRS) and two intermediate states (i.e., IHRS and ILRS) may be defined for a two-bit memory cell. In some embodiments, additional intermediate states may be defined. The resistive switching may be performed by applying switching voltages to electrodes 102 and 106. Depending on magnitude and polarity of these voltages, filament 110 may be broken or formed back again. These voltages may be substantially lower than forming voltages (i.e., voltages used in the forming operation) since much less mobility of defects is needed during switching operations. For example, hafnium oxide based resistive layers may need about 5 Volts during their forming but can be switched using voltages less than 3 Volts.

The resistance difference between the resistive states is due to different number, formation stage, and/or conductivity of conductive paths that exist in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the IHRS, ILRS or LRS.

When switching from its LRS to ILRS, IHRS or HRS, which is often referred to as a reset or erase operation, resistive switching layer 104 may release some defects into top electrode 102. Furthermore, there may be some mobility of defects within resistive switching layer 104. This may lead to thinning and, in some embodiments, breakages of conductive paths (see HRS). Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to IHRS, ILRS or LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths (see IHRS to LRS). In some embodiments, a voltage applied to electrodes 102 and 104 during the set operation has the same polarity as a voltage applied during the reset operation. This type of switching is referred to as unipolar switching. Alternatively, a voltage applied to electrodes 102 and 104 during the set operation may have different polarity than a voltage applied during the reset operation. This type of switching is referred to as bipolar switching. Setting and resetting operations may be repeated multiple times as will now be described with reference to FIGS. 2A and 2B.

Figure 2A:
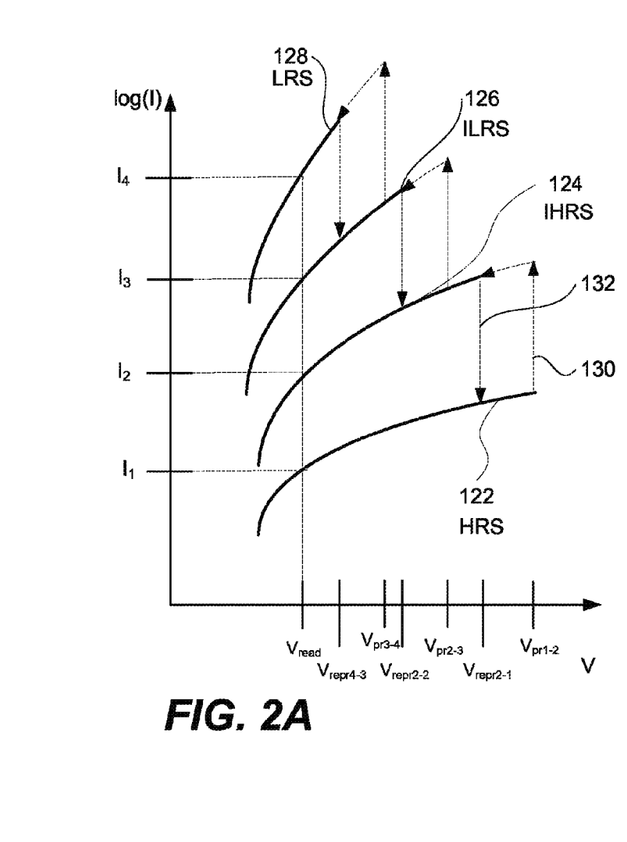
FIG. 2A illustrates a plot of a current passing through a ReRAM cell during unipolar switching and read as a function of a voltage applied to the ReRAM cell, in accordance with some embodiments.
Figure 2B:
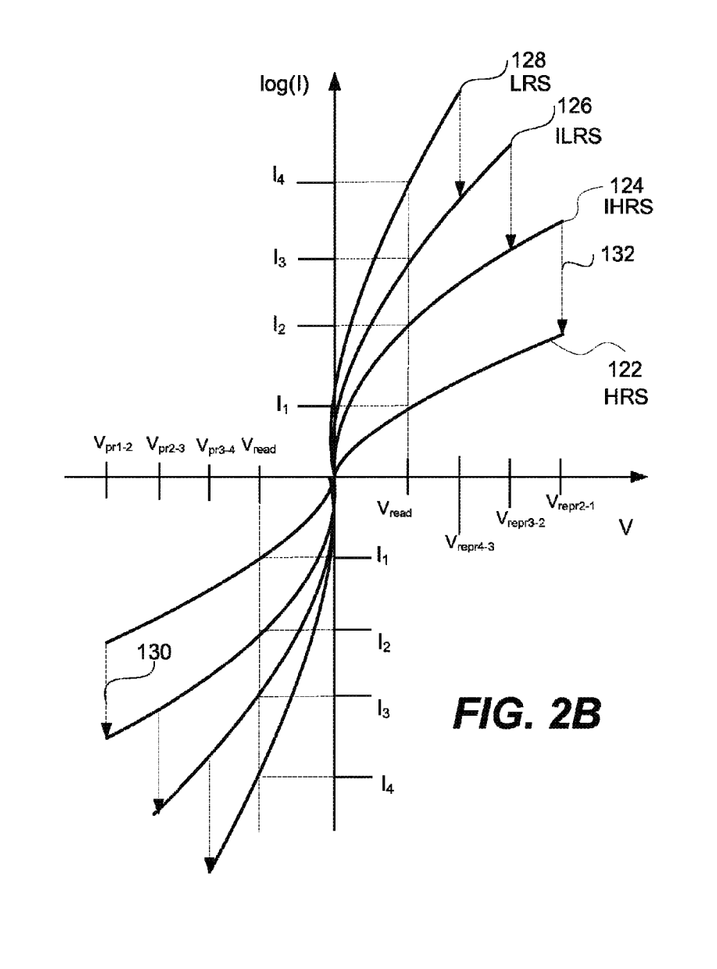
FIG. 2B illustrates a plot of a current passing through a ReRAM cell during bipolar switching as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates a similar plot for a bipolar ReRAM cell, in accordance with some embodiments. The HRS is shown by line 122, the IHRS is shown by line 124, the ILRS—by line 126, while the LRS is shown by line 128 in both plots. Each of these states may be used to represent a different logic state, e.g., the HRS may represent logic "00", IHRS—"01", ILRS—"10" and LRS "11" or vice versa. Therefore, each ReRAM cell that has four resistive states may be used to store two bits of data. It should be noted that some ReRAM cells may have more resistive states allowing storage of even more bits of data in one cell.

Resistive states are substantially distinct and may range from a very conductive (e.g., about 1 kOhm) state to a very resistive (e.g., about 1 MOhm) state. Due to a significant distinction between the states, they can be easily sensed to identify the resistance of the memory cell and determine the corresponding resistive state. In some embodiments, a resistance ratio between different resistive states may be 10 to 1000.

The overall operation of the ReRAM cell may be divided into read pulses, a set of programming pulses (i.e., switching the cell from its HRS to IHRS, ILRS, or LRS), and a set of erase pulses (i.e., switching the cell from its LRS to ILRS, IHRS, or HRS). In some embodiments, cell erase operations involves switching it first to the HRS, and then to a desired resistive state. In other embodiments, the erase operation may be performed directly to any higher resistive state without switching to the HRS.

When applying read pulses, the state of the ReRAM cell or, more specifically, the resistive state of the resistive switching layer can be sensed by applying a sensing voltage to its electrodes. The sensing voltage is sometimes referred to as a "READ" voltage or simply a read voltage and indicated as $V_{READ}$ in FIG. 2. If the ReRAM cell is in its HRS (represented by line 122 in FIGS. 2A and 2B), the external read and write circuitry connected to the electrodes will sense the resulting "1" current ($I_1$) that flows through the ReRAM cell. As stated above, these read pulses may be applied multiple times without changing the resistive state (i.e., switching the cell to a lower resistive state). In the above example, the ReRAM cell should continue to output the "1" current ($I_1$) when the read voltage ($V_{READ}$) is applied to the electrodes for the second time, third time, and so on.

Continuing with the above example, when it is desired to switch the cell that is currently, for example, in the HRS (state "1") to the IHRS (state "2"), programming pulses are applied. This operation may use the same read circuitry to apply a programming voltage ($V_{pr1-2}$) to the electrodes. Applying the programming voltage forms one or more conductive paths in the resistive switching layer as described above with reference to FIGS. 1A-1B. The switching from the HRS to the IHRS is indicated by dashed line 130 in FIGS. 2A and 2B. The resistance characteristics of the ReRAM cell in its IHRS are represented by line 124. When the read voltage ($V_{READ}$) is applied to the electrodes of the cell in this state, the external read and write circuitry will sense the resulting "2" current ($I_2$) that flows through the ReRAM cell. Again, these read pulses may be applied multiple times without switching the state of the ReRAM cell.

Similarly, the ReRAM cell may be switched from the IHRS (state "2") to the ILRS (state "3") by applying programming voltage ($V_{pr2-3}$) and current ($I_3$), and from the ILRS (state "3") to the LRS (state "4") by applying programming voltage ($V_{pr3-4}$) and current ($I_4$). The resistance characteristics of the ReRAM cell in its ILRS are represented by line 126. Line 128 illustrates the resistance characteristics associated with the LRS.

At some point, it may be desirable to switch downwards the ReRAM cell by changing its state from a higher resistive state to a lower resistive state. This operation may be performed by applying erase pulses. During erase operation, an erase voltage (or reset voltage) ($V_{erase}$) may be applied to the ReRAM cell to weaken or break the previously formed conductive paths in the resistive switching layer. For example, switching downwards from the IHRS to the HRS is indicated by dashed line 132. Similarly, the ReRAM cell may be re-programmed from any resistive state to the HRS. Detecting the state of the ReRAM cell after the erase operation is similar to detecting its state after programming and is described above.

Sudden decrease of resistivity of a resistive switching layer associated with switching of a memory cell to a lower resistive state may induce a significant increase in the value of current. The increase in current may cause a substantial increase in the power dissipated by the memory cell resulting in a heating stress, which may cause a further decrease of resistivity of the resistive switching layer or create a permanent damage to the cell, thus impacting further switching of the memory cell. To avoid this, an embedded resistor may be added to the cell and connected in series with the resistive switching layer. In this way, the resistance of the embedded resistor may remain constant, so the rapid changes in resistance of the resistive switching layer do not cause proportional changes in current. Another way to control heating used in some embodiment is modifying of the programming pulse width described below.

It should be noted that polarity of the erase voltage (i.e., the reset voltage) and the programming voltage (i.e., the set voltage) may be the same as shown in FIG. 2A or different as shown in FIG. 2B. The cells that have the same polarity of programming and erase voltages are referred to as unipolar cells, while the cells that have different polarities of programming and erase voltages are referred to as bipolar cells.

Overall, the ReRAM cell may be switched back and forth between its resistive states many times. Read operations may be performed in each of these states (between the switching operations) multiple times or not performed at all. It should be noted that application of programming and erase voltages to change resistive states of the ReRAM cell involves complex mechanisms that are believed to involve localized resistive heating as well as mobility of defects impacted by both temperature and applied potential.

In some embodiments, the programming voltages ($V_{pr}$) may be reapplied with an increment of 0.1V to 0.3V until a particular resistive state is determined by the read pulses. The length of programming voltage pulses may be less than about 1 microsecond, or, more specifically, less than about 500 nanoseconds and even less than about 100 nanoseconds. In some embodiments, the length of programming (and erase) voltage pulses may be modified by varying the pulse in accordance to the resistive state to be set. Thereby the voltage potential applied to the resistive switching layer varies correspondingly modifying the resistance of the memory cell.

The read voltage ($V_{READ}$) may be between about 0.1 and 0.5 of the programming voltage ($V_{pr}$). In some embodiments, the read currents ($I_1$-$I_4$) are greater than about 1 microA or, more specifically, greater than about 5 microA to allow for a fast detection of the state by reasonably small sense amplifiers. The length of a read voltage pulse may be comparable to the length of the corresponding programming voltage pulse or may be shorter than the programming voltage pulse. ReRAM cells should be able to cycle between LRS and HRS between at least about $10^3$ times or, more specifically, at least about $10^5$ times without failure. A data retention time should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include three or more resistive switching layers interconnected in series. Adjacent resistive switching layers may directly interface each other or be separated by an intermediate layer.

Examples of ReRAM Cells

Figure 3:
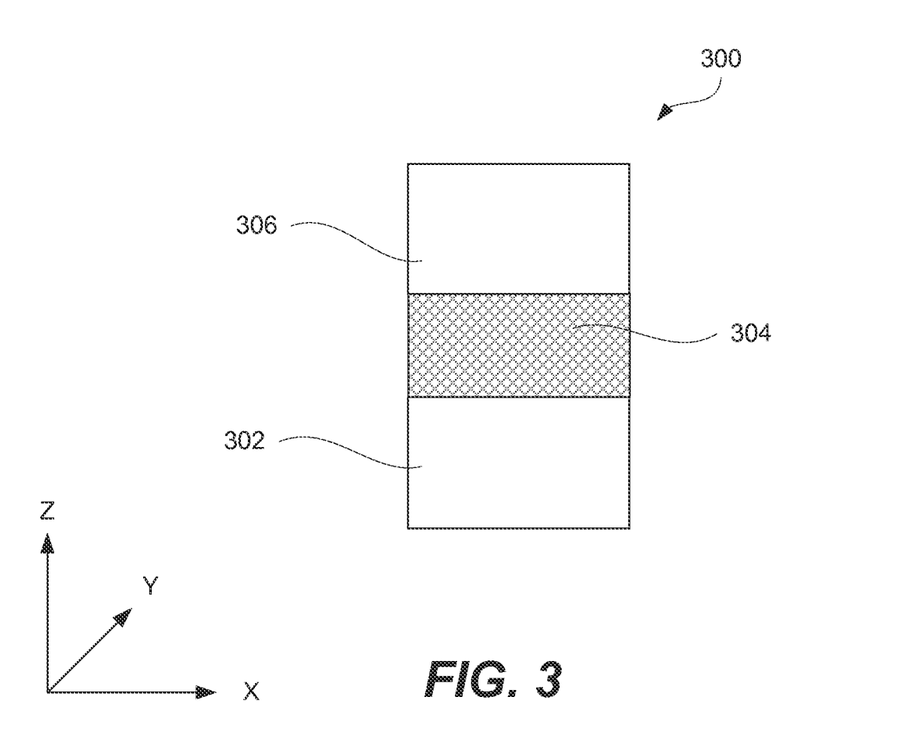
FIG. 3 illustrates a schematic representation of a ReRAM cell, in accordance with some embodiments.

FIG. 3 illustrates a schematic representation of ReRAM cell 300, in accordance with some embodiments. ReRAM cell 300 may include first electrode layer 302, resistive switching layer 304, and second electrode layer 306. The "first" and "second" terminology is used herein only for differentiating reasons and does not imply any deposition order or spatial orientation of the layers unless specifically noted.

First electrode layer 302 and second electrode layer 306 provide electrical connections to ReRAM cell 300. In some embodiments, first electrode layer 302 and/or second electrode layer 306 are parts of signal lines that extend between multiple ReRAM cells, which may be cells provided in the same row or column a memory array as further described below with reference to FIGS. 5 and 6. In some embodiments, first electrode layer 302 and/or second electrode layer 306 may be separate components from the signal lines. For example, first electrode layer 302 or second electrode layer 306 may be an intermediate electrode and additional components, such as a diode may be provided between this electrode and a signal line.

First electrode layer 302 and second electrode layer 306 are typically made from conductive materials. Some examples of suitable electrode materials include n-doped polysilicon, titanium nitride, ruthenium, iridium, platinum, and tantalum nitride. Second electrode 306 may be formed from inert materials as described above. First electrode layer 302 and/or second electrode layer 306 may have a thickness of less than about 1,000 Angstroms, such as less than about 500 Angstroms and even less than about 100 Angstroms. Thinner electrodes may be formed using ALD techniques. In some embodiments, second electrode 306 directly interfaces resistive switching layer 304.

In some embodiments, first electrode 302 does not directly interface resistive switching layer 304 and a diffusion barrier layer (not shown) is disposed between first electrode 302 and resistive switching layer 304. Various examples of materials for diffusion barrier layer and first electrode 302 are described below.

In some embodiments, ReRAM cell 300 includes a current limiting layer. The current limiting layer may be a separate component (not shown). Alternatively, one of diffusion barrier layer, top electrode 306, or bottom electrode 302 can function as a current limiting layer. The current limiting layer may be formed from a material having a suitable work function for controlling the electron flow through ReRAM cell 300.

Resistive switching layer 304 may be formed from materials capable of resistive switching and exhibiting multistate resistive state. In some embodiments such materials may include metal oxides, for example, hafnium oxide ($HfO_x$), zirconium oxide ($ZrO_x$), silicon oxide ($SiO_x$), and combinations of titanium oxide ($TiO_x$) and aluminum oxide ($AlO_x$), and so forth. In other embodiments, resistive switching layer 304 may be formed from perovskites and/or metal nitrides. Some examples of suitable nitrides include hafnium nitride and aluminum nitride.

In some embodiments, resistive switching layer 304 includes multiple sub-layers. For example, resistive switching layer 304 includes a titanium oxide sub-layer, a hafnium oxide sub-layer, and a silicon oxide sub-layer. The hafnium oxide sub-layer may be disposed in between the titanium oxide sub-layer and the silicon oxide sub-layer. The titanium oxide sub-layer may interface a titanium nitride electrode, while the silicon oxide sub-layer may interface a doped polysilicon electrode. In some embodiments, the titanium oxide sub-layer may be disposed in between the hafnium oxide sub-layer and the silicon oxide sub-layer. The hafnium oxide sub-layer may interface a titanium nitride electrode, while the silicon oxide sub-layer may interface a doped polysilicon electrode. The thickness of each sub-layer may be between about 5 Angstroms and 75 Angstroms. For example, the thickness of titanium oxide sub-layer may be between about 5 Angstroms and 15 Angstroms, such as about 8 Angstroms. The thickness of hafnium oxide sub-layer may be between about 25 Angstroms and 100 Angstroms, such as about 50 Angstroms. The thickness of silicon oxide sub-layer may be between about 10 Angstroms and 50 Angstroms, such as about 20 Angstroms.

Different resistive states may correspond to changes in conductive paths in each of these layers. For example, switching from a high resistive state to an intermediate high resistive state may correspond to forming a conductive path through the titanium oxide sub-layer, while switching from the intermediate high resistive state to an intermediate low resistive state may correspond to forming a conductive path through the hafnium oxide sub-layer. Furthermore, switching from the intermediate low resistive state to a low resistive state may correspond to forming a conductive path through the silicon oxide sub-layer.

In some embodiments, metal oxides with a bandgap greater than 3 eV may be used. Some of examples of such oxides include hafnium oxide, aluminum oxide, tantalum oxide, zirconium oxide, and yttrium oxide.

In certain embodiments, the thickness of resistive switching layer 304 is between about 10 Angstroms and 500 Angstroms or, more specifically, between about 50 Angstroms and 200 Angstroms. Selection of materials and thickness values for resistive switching layers determine some of the radiation parameters used for creating defects in these layers.

Resistive switching layer 304 may be doped with titanium, hafnium, and aluminum. Such doping may provide impurities changing the conductivity of resistive switching layer 304. Impurities may include foreign atoms which are incorporated into the crystal structure of resistive switching layer 304. These atoms may provide predominantly negative (n-type) or positive (p-type) charge carriers depending on the dopant used. Dopants may be introduced in resistive switching layer 304 using various techniques. Their concentration may vary from low or light (on the order of one dopant atom is added per 100 million atoms) to heavy or high (on the order of one per ten thousand atoms).

In some embodiments, resistive switching layer 304 may be doped with titanium. Resistive switching layer 304 suitable for doping with titanium may include hafnium oxide. In titanium doped resistive switching layer 304, the formation energy of oxygen vacancies may decrease substantially in comparison to undoped materials. In some embodiments, resistive switching layer 304 may contain about less than about 10% atomic of titanium.

In other embodiments, resistive switching layer 304, such as silicon oxide, may be doped with hafnium. The influence of the doping may include decreased programming voltages. The concentration of hafnium within resistive switching layer 304 may be about less than about 10% atomic or, more specifically, between about 2% and 5%.

Processing Examples

Figure 4:
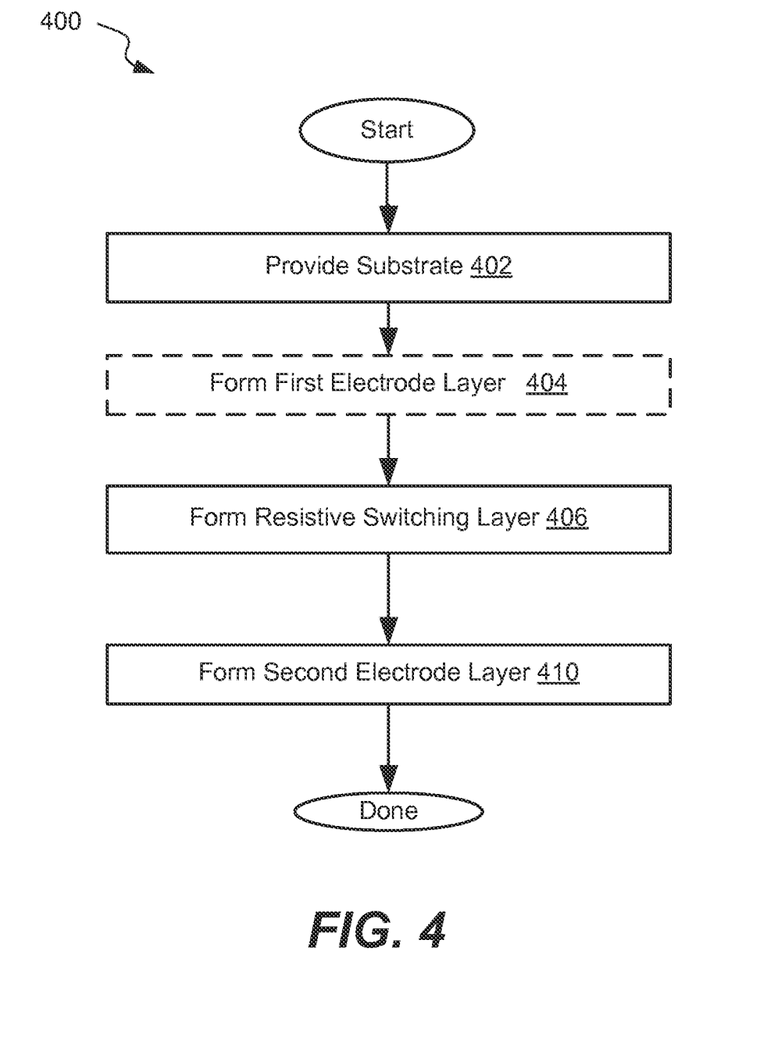
FIG. 4 illustrates a process flowchart corresponding to a method of fabricating a ReRAM cell, in accordance with some embodiments.

FIG. 4 illustrates a process flowchart corresponding to method 400 of forming a ReRAM cell, in accordance with some embodiments. Method 400 may commence with providing a substrate during operation 402. In some embodiments, the provided substrate includes a first electrode layer, in which case method 400 proceeds with forming a resistive switching layer during operation 406. Alternatively, method 400 may proceed with forming a first electrode layer on the provided substrate layer during operation 404. The first electrode layer may be formed from one or more of the following materials: silicon (e.g., n-doped poly-silicon and p-doped poly-silicon), silicides, silicide-germanides, germanides, titanium, titanium nitride (TiN), platinum, iridium, iridium oxide, ruthenium, ruthenium oxide, and the like. Generally, any sufficiently conductive material may be used to form an electrode. In some embodiments, barrier layers, adhesion layers, antireflection coatings and/or the like may be used with the electrodes and to improve device performance and/or aid in device fabrication.

In some embodiments, one electrode layer may be a higher work function material, and the other electrode layer may be a lower work function material. For example, a noble or near noble metal (i.e., a metal with a low absolute value free energy change ($|\Delta G|$) of oxide formation) may be used for one electrode layer. Specific examples include iridium, iridium oxide, platinum, ruthenium, and ruthenium oxide. The other electrode layer may be a lower work function material, such as titanium nitride. In specific embodiments, the reset pulse at the electrode having the higher work function is a positive pulse.

In some embodiments, one or both electrodes of a ReRAM cell may be multi-layered electrodes formed by one or more different materials. For example, an electrode can include a base layer and capping layer. The base layer may include ruthenium, ruthenium oxide, iridium, iridium oxide, platinum, and various combinations thereof. The capping layer may include tungsten, tungsten carbonitride, and/or tungsten carbon. The multi-layer electrodes can be used to improve adhesion properties and performance of ReRAM cells.

In some embodiments, the first electrode layer includes titanium nitride and may be formed using PVD or other suitable deposition techniques. Deposition of the titanium nitride electrode may be performed using a titanium target in a nitrogen atmosphere maintained at a pressure of between about 1-20 mTorr. The power may be maintained at 150-500 Watts with resulting in a deposition rate of about 0.5-5 Angstroms per second. These process parameters are provided as examples and generally depend on deposited materials, tools, deposition rates, and other factors. Other processing techniques, such as ALD, PLD, CVD, evaporation, and the like can also be used to deposit the first electrode.

Method 400 may proceed with forming a layer of a resistive switching layer during operation 406. The resistive switching layer may be formed directed over the first electrode or one or more additional layers provided in between the resistive switching layer and first electrode. For example, operation 410 may be performed prior to operation 406 and a diffusion barrier layer may be formed before the resistive switching layer. In this situation, the diffusion barrier layer is provided in between the first electrode layer and the resistive switching layer. Otherwise, the diffusion barrier layer is provided in between the second electrode layer and the resistive switching layer.

The resistive switching layer may be deposited using PVD or other suitable techniques. For example, a hafnium oxide layer having a thickness of between about 5-500 Angstroms may be formed using reactive sputtering by employing a metal hafnium target in a 20-60% oxygen atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors. Other processing techniques, such as ALD, PLD, CVD, evaporation, and the like can also be used to deposit the resistive switching layer. For example, ALD can be used to form a hafnium oxide layer using hafnium precursors, such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$), and a suitable oxidant, such as water, oxygen plasma, or ozone.

Method 400 may continue with depositing a second electrode layer during operation 410. The second electrode layer may be deposited in a manner similar to the first electrode layer described above with reference to operation 404. In some embodiments, the thickness of the second electrode layer is less than 200 Angstroms or, more specifically, less than about 100 Angstroms.

Memory Array Examples

Figure 5:
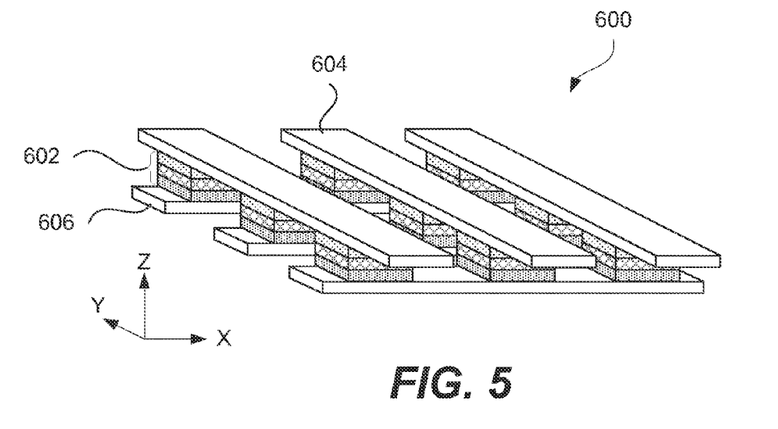
FIGS. 5 and 6 illustrate schematic views of memory arrays including multiple ReRAM cells, in accordance with some embodiments.

A brief description of memory arrays will now be described with reference to FIGS. 5 and 6 to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5 illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistive state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

The device circuitry may also include current limiting circuitry to limit the pulse current that is output by the device circuitry. In some embodiments, the current limiter may limit the total current applied to the bit line. In other embodiments, the current limiter may be implemented on the word line. The current limiter may be any of the known circuits, and may be included in any circuit component of the memory cell. One example of a current limiter is a transistor resulting in a one transistor-one resistor (1T1R) (structure, i.e., transistor being in series with a resistive switching layer.

Figure 6:
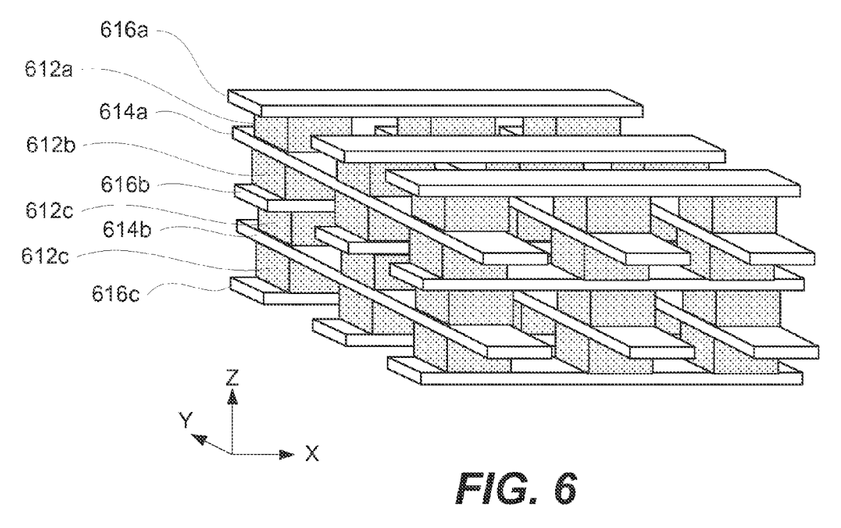

In some embodiments, a memory device may include multiple array layers as, for example, illustrated in FIG. 6. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

Multistate Operational Switching of ReRAM Cell

Figure 7:
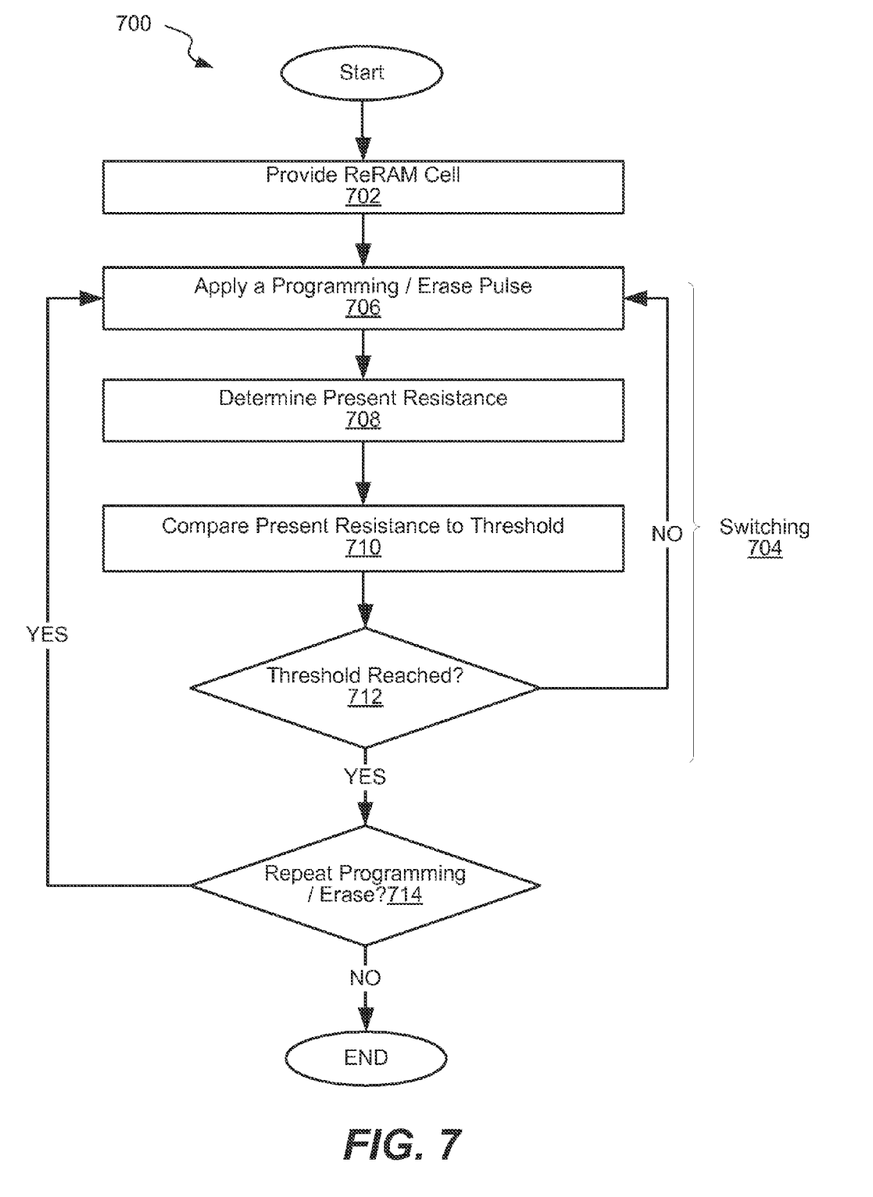
FIG. 7 illustrates a process flowchart corresponding to a method of switching a ReRAM among three or more resistive states, in accordance with some embodiments.

A method 700 for multistate operational switching of ReRAM cells is illustrated in FIG. 7. Method 700 may provide for extended storage capacity due to multibit operation of a single ReRAM cell. Method 700 may start with providing a ReRAM cell capable of multistate switching at operation 702. The ReRAM cell may be initially formed and may be provided at a certain resistive state. For example, the ReRAM cell may be provided in its HRS or first resistive state. In some embodiments, method 700 may involve applying read pulses to determine the current resistive state of the provided ReRAM cell. In other embodiments, this state is known. The resistive state of the provided ReRAM cell may be associated with a certain bit pattern, for example "00".

Method 700 may proceed with a switching process 704 that may involve a number of different operations. For example, switching process 704 may involve applying a set of programming or erase pulses during operation 706, determining a new resistive state during operation 708, comparing this new resistive state to the threshold during operation 710, and determining whether the threshold was reached and whether an additional set of programming or erase pulses is needed during operation 712. As noted above, programming pulses are applied to switch the cell resistance to a higher state, while erase pulses are applied to set the cell resistance to a lower state. Each of these operations will now be described in more details.

Sometimes, switching process 704 may be referred to as applying a set of programming or erase pulses to the ReRAM cell. The set may include only one pulse or multiple pulses depending on how effective each pulse. For example, each programming set may include multiple pulses, while each erase set may include only one pulse. The programming pulses may be applied again after a read pulse, if, e.g., the read pulse outputs the voltages that is not within the threshold range. In some embodiments, a set of programming pulses may include less than three pulses.

Operation 706 involves applying a programming or erase pulse to the ReRAM cell. Characteristics of the pulse to apply (e.g. voltage, duration) may be associated with the current and/or the desired resistive state. For example, if the resistance of the memory cell needs to be increased, then one type of pulses is used. On the other hand, if the resistance of the memory cell needs to be decreased, then another type (e.g., having an opposite polarity) of the pulse may be used. Changes in resistance after each programming or erase pulse may be less than 50% of the difference between the two closest resistive stated or, more specifically, less than 33% and even less than 25%. In other words, more than 2, 3, or 4 pulses may be needed to change a cells between the two closest resistive states. Gradual changes in resistance (e.g., less than 500% relative to the starting resistance, i.e., the resistance at the start of the pulse) during programming and/or erased pulses may be preferred to abrupt changes (e.g. more than 1000%).

After applying one or more programming or erase pulse, the present resistance of the ReRAM cell may be determined at operation 708 by applying a read pulse. The voltage of the read pulse may be relatively low (in comparison to switching pulses) in order to avoid modifying of the resistive state of ReRAM cell by a read pulse. In some example embodiments, the read voltage may be between about 10% and 50% of the programming or erase voltage. In some embodiments, the read currents are greater than about 1 microA or, more specifically, greater than about 5 microA to allow for a fast detection of the state by reasonably small sense amplifiers. The duration of a read voltage pulse may be comparable to the length of the corresponding programming pulse or may be shorter than the programming voltage pulse.

The determined present resistance of the ReRAM cell may be compared to a threshold associated with a resistive state to be set (i.e., the desired resistive state) during operation 710. In some embodiments, the threshold may be a predetermined value that is associated with a certain resistive state during a procedure of forming the ReRAM cell. For example, the HRS may be associated with a value of 1e+8 ohms, the IHRS—5e+7 ohms, the ILRS—1e+7 ohms, and the LRS—5e+6 ohms.

In other embodiments, the threshold may be determined from ratios associated with different resistive states of the cell. For example, the resistance ratio of the HRS to the IHRS may be set to 10, the HRS to the ILRS—100, the HRS to the LRS—1000. Thus, it may be determined that the ReRAM cell has switched from the HRS to the IHRS, when the resistance of the ReRAM cell has increased by 10 times in comparison to the resistance associated with the HRS. Though widely spaced resistive states are desirable for their accurate read, other ratios of resistive states may be used. For example, a ratio of the HRS to the IHRS and a ratio of the IHRS to the ILRS may both be about 5.

Based on the comparison, it may be determined at operation 712 whether the threshold is reached. If the threshold for the desired resistive state is not reached, the method 700 may continue with operation 706 by re-applying a programming pulse. The pulse voltage may be correspondingly modified to change the resistance of ReRAM cell. For example, for a set of programming pulses, the voltage of each successive pulse may be increased with a certain step. In some embodiments, the step for increasing the voltage of each successive pulse may be from 0.1 v to 0.3 v.

Thus, the next applied pulse may have a voltage increased by 0.1 v to 0.3 v. After that pulse, read may be repeated to identify whether the resistance of the cell corresponds to the resistance threshold of the desired resistive state. If not, a programming pulse increased by one more step may be applied. Read and incrementally increasing programming pulses may repeat until the desired resistive state is reached. In this way, reliability of switching may be increased due to a read pulse determining whether the ReRAM cell is switched to the desired state.

Therefore, operations 706-712 may repeat, until it is determined at operation 712 that the desired threshold is reached, so the resistance of the ReRAM cell corresponds to the desired resistive state. When this happens, the ReRAM cell may stay in this state until a command to repeat switching of the ReRAM cell to another resistive state is received at operation 714. Then, the method 700 may continue with operation 706 by applying a programming or erase pulse in accordance with the desired resistive state.

Therefore, the described method provides for multistate switching of the ReRAM cell. Widely spaced resistive states (i.e., states associated with the resistances that are detectably different) may facilitate read accuracy, while the relatively low programming voltage may provide for extended lifetime of the ReRAM cell. Moreover, in contrast to charge-based memories, resistive random access memory is non-volatile memory due to the fact that the resistance change that represents the data stored is based on the formation from neutral atoms.

Experimental Data

Four types of cells were fabricated and tested. All four types had a titanium nitride electrode and a doped polysilicon electrode as well as two or three sib-layers collectively forming a resistive switching layer. The first type included two sub-layers: a 30 Angstroms thick hafnium oxide sub-layer interfacing the titanium nitride electrode and a 20 Angstroms thick silicon oxide sub-layer interfacing the doped polysilicon electrode. The second type also included two sub-layers: a 50 Angstroms thick hafnium oxide sub-layer interfacing the titanium nitride electrode and a 20 Angstroms thick silicon oxide sub-layer interfacing the doped polysilicon electrode. The third type included three sub-layers: a 50 Angstroms thick hafnium oxide sub-layer interfacing the titanium nitride electrode, a 20 Angstroms thick silicon oxide sub-layer interfacing the doped polysilicon electrode, and 8 Angstroms thick titanium oxide sub-layer disposed between the hafnium oxide sub-layer and the silicon-oxide sub-layer. Finally, the fourth type also included three sub-layers: a 8 Angstroms thick titanium oxide sub-layer interfacing the titanium nitride electrode, a 20 Angstroms thick silicon oxide sub-layer interfacing the doped polysilicon electrode, and 50 Angstroms thick hafnium oxide sub-layer disposed between the titanium oxide sub-layer and the silicon-oxide sub-layer.

An array of cells of each type was tested for a resistance ratio of the high resistive state to the low resistive state. The cells that had this ratio greater than 100 considered to have passed the test, while the cells having lower values of this ratio considered to have failed the test. Less than 10% of the first type cells have passed the test. Slight over 25% of the second type cells have passed the test and about 35% of the third type cells have passed the test. However, over 85% of the fourth type cells have passed the test indicating that this type of configuration is the most beneficial out of the four tested types for a multi-bit architecture. The results of the experiment are also summarized in the table below.

TABLE

Yield of Resistance Ratio Test

| Cell Configuration | Yield |
|---|---|
| TiN/30 Å HfOx/20 Å SiOx/doped-Si | <10% |
| TiN/50 Å HfOx/20 Å SiOx/doped-Si | ~25% |
| TiN/50 Å HfOx/8 Å TiOx/20 Å SiOx/doped-Si | ~35% |
| TiN/8 Å TiOx/50 Å HfOx/20 Å SiOx/doped-Si | >85% |

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of switching a resistive random access memory (ReRAM) cell among three or more resistive states, the method comprising:
   providing the ReRAM cell comprising a resistive switching layer,
      wherein the resistive switching layer comprises a first sub-layer, a second sub-layer, and a third sub-layer such that the second sub-layer is disposed between the first sub-layer and the second sub-layer,
      wherein the first sub-layer comprises titanium oxide having a thickness of about 8 Angstroms,
      wherein the second sub-layer comprises hafnium oxide having a thickness of about 50 Angstroms, and
      wherein the third sub-layer comprises silicon oxide having a thickness of about 20 Angstroms,
      wherein the resistive switching layer has a first resistance;
   applying a first set of programming pulses to the ReRAM cell,
      wherein, after applying the first set of programming pulses, the resistive switching layer has a second resistance less than the first resistance; and
   applying a second set of programming pulses to the ReRAM cell,
      wherein, after applying the second set of programming pulses, the resistive switching layer has a third resistance less than the second resistance, and
      wherein a ratio of the first resistance to the third resistance is between 10 and 1000.

2. The method of claim 1, wherein the ratio of the first resistance to the third resistance is between 100 and 1000.

3. The method of claim 1, wherein the ratio of the first resistance to the second resistance is between 5 and 1000.

4. The method of claim 3, wherein the first set of programming pulses has less than three programming pulses.

5. The method of claim 1, wherein a voltage of each programming pulse in the first set of programming pulses is increased by a predetermined value.

6. The method of claim 1, wherein applying the first set of programming pulses further comprises applying a read pulse after each programming pulse, wherein the read pulse is used to determine a current resistive state of the ReRAM cell and determine whether an additional programming pulse is needed.

7. The method of claim 1, wherein a ratio of the second resistance to the third resistance is between 5 and 1000.

8. The method of claim 1, wherein the second set of programming pulses has less than three programming pulses.

9. The method of claim 1, further comprising applying a third set of programming pulses to the ReRAM cell,
   wherein, after applying the third set of programming pulses, the resistive switching layer has a fourth resistance less than the third resistance, and
      wherein a ratio of the third resistance to the fourth resistance is between 5 and 1000.

10. The method of claim 1, further comprising applying a set of erase pulses to the ReRAM cell,
   wherein, after applying the set of erase pulses, the resistive switching layer has the first resistance.

11. The method of claim 10, wherein the set of erase pulses includes less than four pulses.

12. The method of claim 10, wherein applying the first set of erase pulses further comprises applying a read pulse after each programming pulse, wherein the read pulse is used to determine a current resistive state of the ReRAM cell and determine whether an additional erase pulse is needed.

13. The method of claim 1, wherein applying the first set of programming pulses to the ReRAM cell comprises:
   (a) applying a programming pulse;
   (b) determining a present resistance of the resistive switching layer; and
   (c) comparing the present resistance to a threshold resistance and repeating (a)-(c) if the present resistance is higher than the threshold resistance.

14. The method of claim 1, wherein two sequential pulses in the first set of programming pulses have a voltage difference of between 0.1V and 0.3V.

15. The method of claim 1, further comprising applying a set of forming pulses before applying the first set of programming pulses.

16. The method of claim 1, wherein the resistive switching layer comprises a dopant, the dopant comprises one of titanium, hafnium, or aluminum.

17. The method of claim 1, wherein the first sub-layer directly interfaces a first electrode, wherein the third sub-layer directly interfaces a second electrode.

18. The method of claim 17, wherein the first electrode comprises titanium nitride, and wherein the second electrode comprises n-doped polysilicon.

19. A resistive random access memory cell comprising:
   a first electrode layer comprising an oxygen reactive material;
   a second electrode layer comprising an oxygen inert material; and
   a resistive switching layer;
      wherein the resistive switching layer comprises a first sub-layer, a second sub-layer, and a third sub-layer such that the second sub-layer is disposed between the first sub-layer and the second sub-layer, wherein the first sub-layer comprises titanium oxide having a thickness of about 8 Angstroms,
wherein the second sub-layer comprises hafnium oxide having a thickness of about 50 Angstroms, and
wherein the third sub-layer comprises silicon oxide having a thickness of about 20 Angstroms,
the resistive switching layer capable of being switched among four or more different resistive states,
wherein a ratio of resistances in at least two of the four or more different resistive states is between 10 and 1000.

* * * * *